July 26, 1960 T. HAFNER 2,946,970

REPEATER AMPLIFIERS FOR SURFACE WAVE TRANSMISSION

Filed April 11, 1956 3 Sheets-Sheet 1

INVENTOR.
THEODORE HAFNER
BY Theodore Hafner
ATTORNEY

July 26, 1960 T. HAFNER 2,946,970

REPEATER AMPLIFIERS FOR SURFACE WAVE TRANSMISSION

Filed April 11, 1956 3 Sheets-Sheet 2

INVENTOR.
THEODORE HAFNER

BY Theodore Hafner

ATTORNEY

REPEATER AMPLIFIERS FOR SURFACE WAVE TRANSMISSION

Filed April 11, 1956 3 Sheets-Sheet 3

INVENTOR.
THEODORE HAFNER
BY Theodor Hafner
ATTORNEY

United States Patent Office 2,946,970

Patented July 26, 1960

2,946,970

REPEATER AMPLIFIERS FOR SURFACE WAVE TRANSMISSION

Theodore Hafner, 265 Riverside Drive, New York, N.Y.

Filed Apr. 11, 1956, Ser. No. 577,571

11 Claims. (Cl. 333—95)

This invention relates to amplifiers and more specifically to repeaters for signals transmitted by means of surface waves.

One of the objects of the invention is to provide an amplifier unit immediately or readily connectible to surface wave transmission systems.

Another object of the invention is to unite with an amplifier especially of the broad band type, at least a portion or element of the surface wave transmission system.

Still another object of the invention is to provide an amplifier unit having output and input circuits or terminals which directly support or are attached to the launching and/or receiving devices or horns of a surface wave transmission system so that amplifier and horns form a single unit.

A further object of the invention is to attach or connect the current conducting element or wire of a surface wave transmission system directly to input and/or output terminals of an intermediate amplifier or repeater unit and to provide means in said amplifier unit for adjusting the tension of the wire.

Still further an object of this invention is to attach or support the launching and/or receiving devices or horns of a surface wave transmission system directly to opposite sides or walls of the housing or chassis of an intermediate amplifier or repeater, and to provide means for preventing or at least reducing inter-coupling between the horns.

An object of the invention also is in intermediate amplifier or repeater units to prevent or reduce radiation from the launching and/or receiving devices or horns directly supported on or attached to such amplifier units.

An additional object of the invention is a new surface wave conducting wire permitting a great degree of tensioning or stretching so as to reduce say, bends or any other deformations to a minimum.

These and other objects of the invention will be more fully understood from the drawings enclosed herewith in which Figs. 1 and 2 represent diagrammatically in front and top elevations respectively, with Fig. 1 being a cross section along lines 1—1 and Fig. 2 being a plan top view of Fig. 1 with cover removed, a broad band amplifier unit embodying certain features of the invention.

Figs. 3 and 4 represent a modified portion of the arrangement shown in Figs. 1 and 2, Figure 4 being a partial section view taken along lines 4—4 of Fig. 3.

Figure 1:
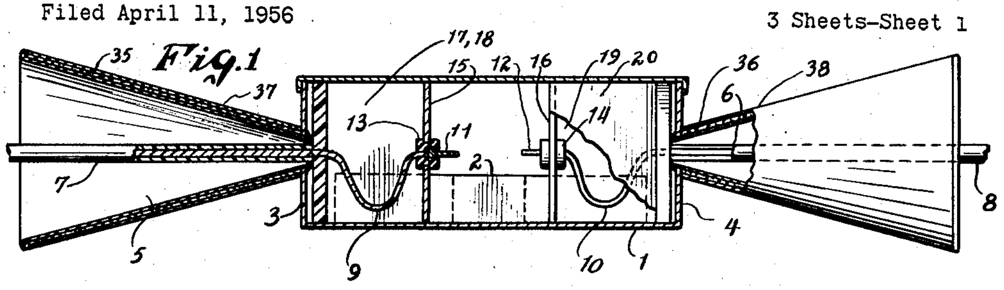
Figure 2:
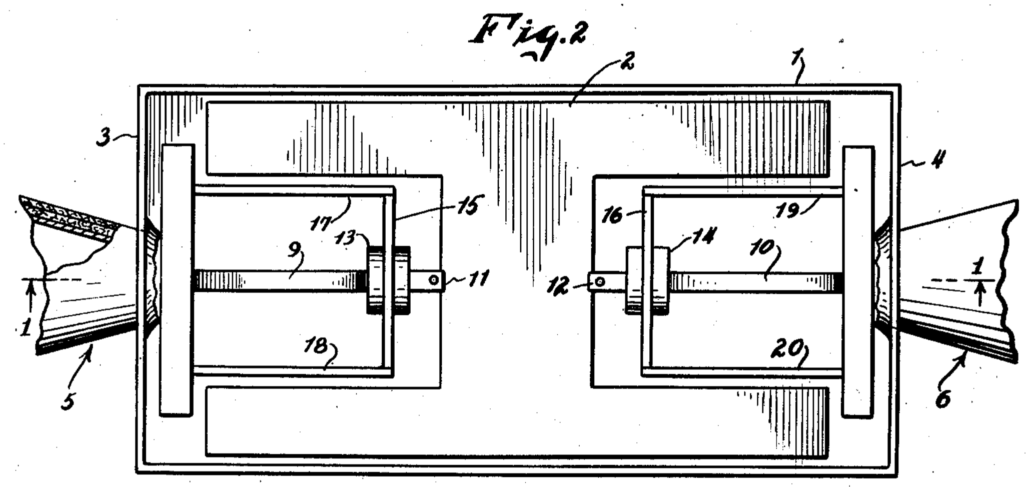

In Figs. 1 and 2 part 1 represents a steel casing or housing of preferably heavy construction such as used in outdoor installations which encloses an amplifier chassis schematically indicated at 2 and supporting at least a great part of the elements of an otherwise well known broad band amplifier circuit such as is used for the simultaneous transmission of a number of television channels, for example extending over a wave range of say 174 to 214 megacycles.

Housing 1 has opposite side walls 3, 4 to which there are directly attached the small ends of horns 5, 6 of a surface wave transmission system, such as disclosed, for example, in U.S. Patent 2,685,068 filed on March 21, 1950, and issued on July 27, 1954.

Figure 3:
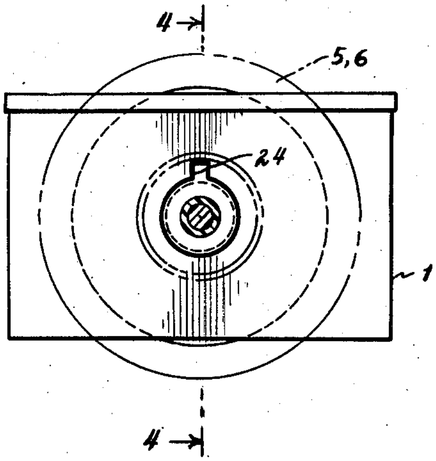

In the particular embodiment of the invention illustrated in Figs. 1, 2 and 3, such horns may have dimensions adapted to launch and receive surface waves extending over a range of say, approximately 150 to 250 megacycles.

The surface wave conductor or wire of the surface wave transmission system under consideration is schematically indicated at 7, 8, and is also designed in accordance with the disclosure in the above mentioned U.S. patent specification.

For example, wires 7 and 8 may consist each of a No. 6 polyethylene coated solid copper wire having an outside diameter which is approximately 2.5 of its inner diameter.

In the present example, and as apparent from Figs. 1, 2 and 3, surface wave conductors 7, 8 are attached each over adjustable and preferably spring loops 9, 10 to input and output terminals 11, 12, respectively, supported on insulating bushings 13, 14 of end walls 15, 16 of pairs of channel plates 17, 18 and 19, 20 respectively.

Each pair of channel plates 17, 18 and 19, 20 respectively is spaced to receive one of conductor loops 9, 10 and is welded or otherwise firmly attached over side walls 3, 4 respectively to supporting horns 5, 6, and adapted to receive the stresses and tensions exerted by surface wave conductors 7, 8 upon amplifier housing 1.

In this way in accordance with the invention, tensioning of surface wave conductors 7, 8 on the launching and receiving sides respectively of amplifier unit 1, is assured automatically without impairing the electrical connections to the amplifier terminals and also without affecting the various electrical matching requirements of the arrangement.

In order to enhance simplicity of such arrangement, horns 4, 5 are so designed as to permit direct connection or attachment at their small ends to the amplifier housing without the inter-position of impedance matching or transforming elements.

For this purpose it has been found useful to provide an amplifier circuit having signal input and output impedances, each preferably being of the order of magnitude of 100 ohms.

This has been found, at least for the frequency range here contemplated, to permit immediate attachment of the horn cones to the amplifier walls.

Thus under control of spring loops 9, 10, tensioning of surface conductors 7, 8 is assured automatically and substantially without affecting mechanical and electrical connections.

Figure 4:
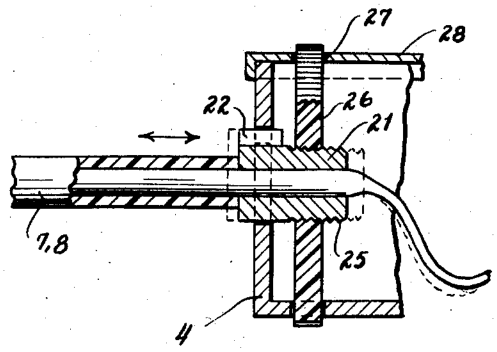

In addition to or instead of providing automatic tension and spring loops of the longitudinal type shown in Figs. 1, 2 and 3 at 9, 10, respectively, a manual adjustment of tension can be provided as exemplified in the modification illustrated in Figs. 3 and 4.

In Figs. 3 and 4 surface wave conductors 7, 8 are shown to be provided with insulating sleeves 21, made, if necessary, of one piece with the insulation of surface wave conductors 7, 8. Sleeve 21 in turn is provided circumferentially with a projection or key portion 22 cooperating with a corresponding slot 24 diagrammatically shown in Fig. 3 in front plates 3 or 4 or both, as the case may be, and also provided with an outer thread 25 fitting into a corresponding inner thread of a strong disc made of insulating material such as fibre glass and schematically indicated at 26. Disc 26 is rotatably held between the inside of wall 3 and the edges of channels 17, 18.

Rotation of disc 26 about a horizontal axis can be caused through a slot 27 in upper wall 28 of amplifier housing 1, and will cause a longitudinal movement of surface wave conductors 7, 8 and adjustment of its tension, independent of the fact whether or not there is a spring loop adjoining conductors 7, 8.

Figure 5:
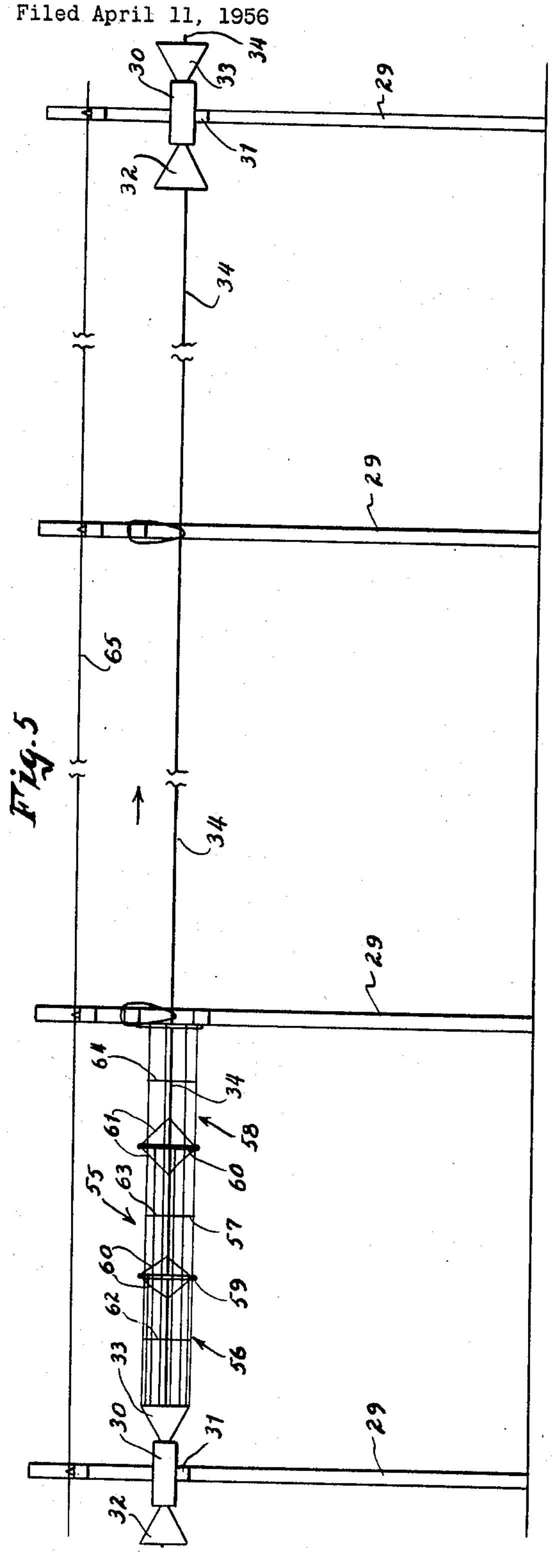
Fig. 5 represents diagrammatically a surface wave transmission system incorporating amplifier units such as illustrated in Figs. 1 and 2 or Figs. 3 and 4 respectively.

In this way, as apparent from Fig. 5, a surface wave transmission system can be arranged along a great number of telegraph or power poles schematically indicated at 29, with a number of amplifier units 30 of the type shown in Figs. 1, 2 and 3 on cross arms 31 of poles 29 at appropriate distances from each other, depending upon the attenuation of the surface wave transmission system and the amplification factor of units 30, say every four miles or on about every 160th pole when the average pole distance is assumed to be about 120 feet.

Amplifiers 30 are interconnected through receiving and transmitting horns supported thereon and shown at 32, 33 respectively and surface wave conductors 34 cooperating with receiving and transmitting horns 32 and 33.

Tensioning of conductors 34 can be achieved in the manner indicated in Figs. 1, 2 and 3 or 4 and amplification obtained from amplifier units 30, thereby permitting broad band transmission or transmission of a great number of television or other signal channels over practically any desired distance.

In order to prevent inter-coupling of horns 32, 33 in Fig. 5 or horns 5, 6 in Figs. 1, 2 and 3, at least a peripheral section of the outer surface of these horns, if not the entire outer surface, can be covered with a wave absorbing substance.

As shown for example in Fig. 1 and for the frequency range under consideration, loose steel wool packing as schematically indicated at 35, 36 has been found to reduce inter-coupling over a frequency range from around 150 to 250 megacycles.

At higher and very high frequencies, rubber compound coatings having carbon particles incorporated therein, have been found useful.

In order to prevent an access of humidity to steel wool packings 35, 36, such packings are covered up by a water tight enclosure made, for example, of tar paper as schematically indicated in Fig. 1 at 37, 38 respectively.

Figure 6:
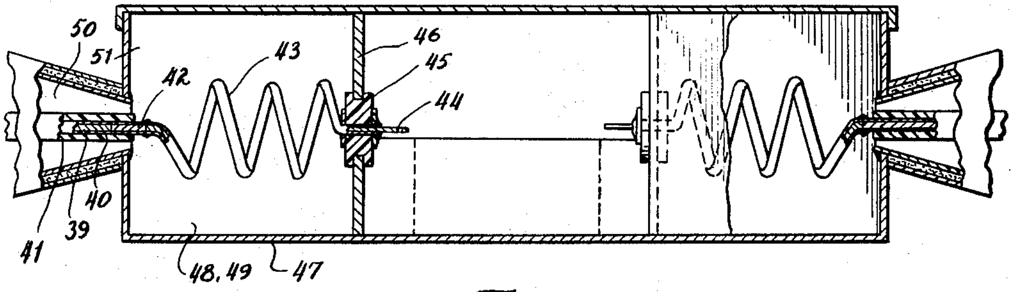
Figs. 6 and 7 represent in cross sections and in front and top views respectively a new surface wave conductor in accordance with the invention, and combined with a broad band amplifier unit, also in accordance with the invention.
Figure 7:
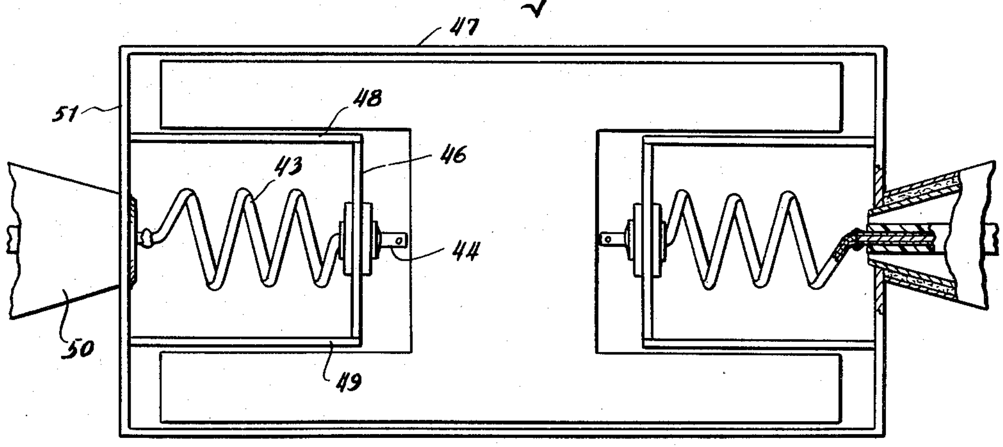

Further in accordance with a particular embodiment of the invention, as exemplified in the showing of Figs. 6 and 7, the surface wave conductor is made to consist of a steel wire 39 provided with a relatively thin electroplated conductive coating 40 for example, of say .002 inch of copper layer.

Copper layer 40 is provided in the usual manner for transmission of surface waves with a dielectric coating 41 of appropriate dimensions such as having an outer diameter of 2.5 of the inner diameter of the conductor proper or, in this case, of the outer diameter of copper coating 40.

At 42 there is shown welded or otherwise attached to conductor 40 an intermediate bolt or wire piece 42 which in turn is welded to or formed with the end portion of a strong coil spring 43 made of Phosphor bronze or spring steel which preferably like bolt 42 is made surface conductive or copper plated to permit continuation of the surface wave to the amplifier terminals in the manner shown in Figs. 1, 2 and 3, or in any other appropriate manner.

As apparent from Figs. 6 and 7 the inner end of spring 43 is connected and attached to a terminal bolt 44 supported on an insulating bushing 45 in a front wall or front wall extension 46 of amplifier housing 47.

The entire coil spring 43 is shown arranged in the space or channel found between supporting plates 48, 49 and forming a solid connection between the small end of horn 50 to the front plate 51 of amplifier housing 47 in a manner similar to that indicated in Figs. 1, 2 and 3.

Rotation of coil spring 43 around its axis can be used in otherwise well known manner to adjust its springiness and thereby to control the tension of surface wave conductor 39.

Figure 8:
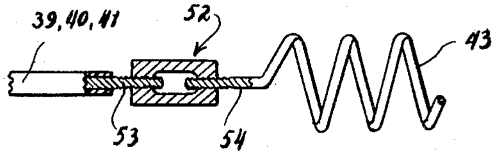
Fig. 8 represents in cross section a portion of the arrangement of Figs. 6 and 7 in a modified version.

This effect can be facilitated or enhanced, for example, by providing instead of welded attachment piece 42 between the end of coil spring 43 and the end of surface wave conductor 39 a screw connection schematically indicated in Fig. 8 at 52 and permitting adjustment of the space between end piece 43 of surface wave conductor 39 and the starting portion 53 of spring 43, but permitting at the same time, if necessary, rotation of spring 43 around its axis and thereby adjustment of tension and length of surface wave conductor 39.

In Fig. 5 there is also indicated, in accordance with another embodiment of the invention, a means for reducing radiation by the arrangement of a number of high resistance wires extending from the circumference of the launching and/or receiving devices, or horns, or at least from some of these horns, axially for a distance of several wave lengths as schematically indicated in Fig. 5 at 55.

In Fig. 5 these wires 55 are made to extend from one pole 29 to the next adjoining pole 29 over a distance of say 100 to 150 ft. at the wave range of 150 to 250 megacycles here under consideration.

Wires 55 may consist of steel provided with a high resistance coating such as a mixture of rubber compound with carbon black, sufficient to eliminate or damp the radial radiation component of the long wire wave existing along surface wave transmission system.

In order to increase efficiency and obtain graduality of damping of this radiation component with increasing distance from horn 33, the number of circumferential wires 55 is gradually reduced with increasing distance from horn 33.

In the example shown in Fig. 5 for instance at first sixteen high resistance wires 55 are circumferentially attached to horn 33 and extend over a space 56 representing a distance of say, thirty feet.

Thereafter, from this point on, another number of say, twelve circumferential wires are provided in parallel over another distance 57 of thirty feet, and finally eight circumferentially arranged wires extend over a space 58 which represents the remaining distance of thirty feet between two adjoining poles 29 whereby it is assumed that the entire pole distance in this case is one hundred and twenty feet.

At the connection points of wire structures 56, 57, 58, steel rings are arranged circumferentially as schematically shown at 58, 59 supporting the different resistance wire structures 56, 57, 58.

Within wire structures 56, 57 and 58 there is arranged surface wave conductor 34 which, if necessary, may be axially centered by the arrangement of radially extending nylon strings schematically indicated, for example, at 60, 61 and attached to rings 59, 60 and also if necessary (but not shown) from time to time to wire structures 56, 57, 58 by radial spikes 62, 63, 64—like the spikes of a wheel—without departing from the scope of this invention.

Poles 29 can of course present ordinary power or communication poles carrying in addition to a surface wave transmitting system of the type illustrated, power or communication lines schematically indicated in Fig. 5 at 65.

In addition, or instead of wire 65, poles 29 can be used to carry another surface wave transmission system of the type shown in Fig. 5 but preferably slightly different in dimension to prevent undesired wave reflection from one line to the other.

In this case the two surface wave conductors of the two surface wave transmission systems may be used to carry power for the intermediate amplifiers. All this without departing from the scope of this disclosure.

The invention is not limited to the arrangement of wave launchers and receivers, wires, amplifiers, housing and housing elements shown and described, nor to the type, size and shape of horns, conductors, strings or their attachments or accessories.

I claim:

1. In a surface wave transmission system, a housing having a pair of opposite side walls and electromagnetic horns fixedly attached thereto at their small ends and extending in opposite directions, and a pair of surface wave conductors extending through said horns also in opposite directions, and each of said surface wave conductors being adjustably attached through a coiled loop to at least part of said housing in the space formed between said side walls and substantially insulated therefrom, means being provided for tensioning each of said surface wave conductors by changing the length of each of said coiled loops.

2. System according to claim 1 wherein said coiled loop includes a longitudinal spring loop.

3. System according to claim 1 wherein said coiled loop includes a coil spring.

4. System according to claim 3 wherein said tensioning means include means for adjusting the radial extension of said coil spring by turning its outer end around its axis.

5. System according to claim 3 wherein said tensioning means include means for adjusting the axial extension of said coil spring by displacing its outer end in axial directions.

6. System according to claim 3 wherein said means include means for adjusting both radial and axial extensions of said coil spring, respectively, by turning its outer end about its axis and by displacing said outer end in an axial direction, substantially independently from each other.

7. System according to claim 1 wherein said surface conductor and said coiled loop include an electrolytically coated steel wire.

8. System according to claim 1 comprising means for wave damping attached to the back of said horns for reducing feedback between said horns.

9. System according to claim 8, comprising resistance means extending from said horns for reducing radiation therefrom.

10. System according to claim 9, wherein said resistance means comprises a number of resistance wires extending from the periphery from at least one of the horns in axial direction and parallel to each other for a length of several wavelengths of the operating frequency range.

11. System for suspension along a series of poles according to claim 10, wherein said resistance wires extend over a distance between adjacent poles.

References Cited in the file of this patent

UNITED STATES PATENTS

| | | |
|---|---|---|
| 2,685,068 | Goubau | July 27, 1954 |
| 2,723,378 | Clavier et al. | Nov. 8, 1955 |
| 2,770,783 | Clavier | Nov. 13, 1956 |
| 2,812,032 | Kock | Nov. 5, 1957 |

FOREIGN PATENTS

| | | |
|---|---|---|
| 135,816 | Australia | Jan. 6, 1950 |
| 814,486 | Germany | Sept. 24, 1951 |
| 679,903 | Great Britain | Sept. 24, 1952 |
| 682,817 | Great Britain | Nov. 19, 1952 |